United States Patent [19]

Allen et al.

[11] 4,081,695

[45] Mar. 28, 1978

[54] BASE DRIVE BOOST CIRCUIT FOR IMPROVED FALL TIME IN BIPOLAR TRANSISTOR LOGIC CIRCUITS

[75] Inventors: Gordon Hadfield Allen; Kenneth Irving Ray, both of Mesa, Ariz.

[73] Assignee: Motorola, Inc., Schaumburg, Ill.

[21] Appl. No.: 756,045

[22] Filed: Dec. 30, 1976

[51] Int. Cl.² .................. H03K 3/29; H03K 19/08
[52] U.S. Cl. .................................. 307/209; 307/280; 307/300; 330/262
[58] Field of Search ............... 307/209, 280, 300; 330/15

[56] References Cited

U.S. PATENT DOCUMENTS

| | | | |
|---|---|---|---|
| 3,181,004 | 4/1965 | Guckel | 307/280 X |
| 3,213,294 | 10/1965 | Okuda | 307/209 |
| 3,978,347 | 8/1976 | Hollstein et al. | 307/280 X |
| 4,042,840 | 8/1977 | Chan | 307/209 X |

*Primary Examiner*—John S. Heyman
*Attorney, Agent, or Firm*—Robert D. Lott

[57] ABSTRACT

An improved fall time is achieved in bipolar transistor logic circuits which have three-state outputs. The circuits comprise a logic input terminal which is coupled to a push-pull output stage to drive a three-state output terminal. A three-state input receives three-state control signals for holding the output transistors in their nonconducting, high impedance state. Improved speed is achieved by adding a feedback circuit to remove stored base charge from the upper output driver transistor and to supply base current derived from the load to the lower output driver transistor during high to low transitions of the output voltage.

3 Claims, 2 Drawing Figures

BASE DRIVE BOOST CIRCUIT FOR IMPROVED FALL TIME IN BIPOLAR TRANSISTOR LOGIC CIRCUITS

BACKGROUND OF THE INVENTION

This invention relates to the field of logic circuits, more particularly to the area of bipolar transistor logic circuits utilizing push-pull output drive stages.

Present push-pull output drive stages of bipolar transistor logic circuits comprise a dual transistor arrangement wherein an upper transistor is coupled between a DC voltage supply and an output load and a lower transistor is coupled between the output load and ground. In operation a high output voltage is realized at the output terminal by turning on the upper transistor and turning off the lower transistor; a low output voltage is realized by turning off the upper transistor and turning on the lower transistor; a high impedance or third state is achieved by turning off both transistors.

It is highly desirable to be able to switch from one output state to the other as fast as possible. In general, increasing the switching speed involves the dual problems of removing the excess stored base charge from one of the output transistors and injecting relatively large amounts of base current into the other output transistor. During the high-to-low transition time or fall time of the output voltage, the upper output drive transistor coupling the power supply to the load must turn off. That is, a charge stored in the base must be removed, and any stray base current such as that coupled through the intrinsic collector-to-base capacitance must also be drained away from the transistor. The lower output drive transistor which couples the load to the ground must, on the other hand, be supplied with a large amount of base current in order to turn the transistor on to in turn provide a low impedance to the load at the output terminal.

Some prior art conventional circuits have used diode coupling from the load back to the base of the lower output drive transistor to supply base current and thereby improve the fall time. However, diode coupling to supply base current is not compatible with a three-state output logic circuits in which the third output state or high impedance state is available along with the normal binary output states. These type of circuits are used in systems wherein several logic circuits share a common output bus as is commonly found in computer architecture. The result is that present three-state transistor logic circuits have no additional circuitry to aid the fall time.

Accordingly, an object of this invention is to improve the fall time in bipolar transistor logic circuits.

It is also an object of this invention to provide additional base drive to the lower output drive transistor during the high to low transition of the output voltage.

It is another object of this invention to remove stored base charge and stray base current due to collector-base capacitance in the upper output drive transistor during high to low transition of the output voltage.

It is still another object of this invention to provide a base drive boost circuit which is compatible with three-state transistor logic circuits.

It is another object of this invention to provide a base drive boost circuit which does not draw current from a DC power supply.

It is still another object of this invention to supply base drive boost current which is proportional to the load capacitance at the output terminal of the circuit.

It is another object of this invention to provide a second path for sinking load current during the fall time of the output.

BRIEF SUMMARY OF THE INVENTION

The present invention relates to a bipolar transistor logic circuit which has a first input terminal for receiving digital logic information which in turn is coupled to a push-pull driver output stage having an upper transistor and a lower transistor for driving an output terminal. A second input is responsive to three-state control signals which in turn are coupled to the push-pull output stage to provide a means for holding the output terminal at a high impedance with respect to ground and the DC power supply. A switchable boost current circuit is coupled between the output terminal and the base of one of the push-pull transistors for removing stored base charge from the upper transistor and for providing a current path from the load to the base of the lower transistor during the high to low transition of the output voltage. The boost current circuit also provides a high impedance to the overall circuit during other phases of circuit operation.

DETAILED DESCRIPTION

Figure 1:
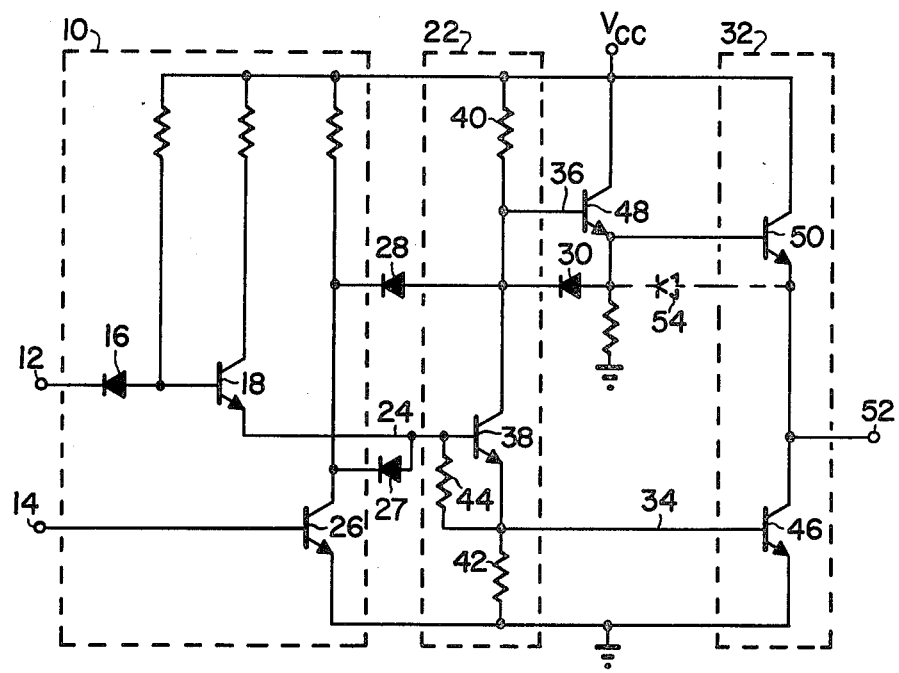
FIG. 1 is a prior art or conventional bipolar transistor logic circuit with three-state output capabilities.

FIG. 1 shows a prior art circuit illustrative of problems associated with maximizing the speed of the output push-pull drive circuit. Shown is an input stage 10 comprising a first input terminal 12 which receives logic signals and a second input terminal 14 which receives three-state control signals. A logic input signal at input 12 is coupled through diode 16, amplified by transistor 18 and connected to the phase splitting stage 22 on line 24. The three-state input 14 is amplified by transistor 26 and coupled through diodes 27 and 28 to the phase splitting stage 22 and subsequently coupled through diode 30 to the push-pull output stage 32.

In order to drive the push-pull output stage 32, the amplified input logic signal on line 24 is split into an in-phase signal at line 34 and an out-of-phase signal at line 36 by a phase splitter stage 22. Stage 22 comprises a transistor 38 and resistors 40, 42 and 44. The in-phase signal at line 34 is connected directly to the lower output transistor 46 of the push-pull output stage 32. The out-of-phase signal appearing at line 36 is amplified by an intermediate transistor 48 and subsequently connected to the upper output transistor 50. Transistors 46 and 50 of the output stage 32 are therefore driven in a push-pull manner to in turn drive a load (not shown) at the output terminal 52.

In order for the logic signal at 12 to be amplified by the input stage 10, divided into a dual phase signal by the phase splitting stage 22, and drive the output drive stage 32, the three-state input at 14 must be at the logical zero voltage level. When input terminal 14 is low, transistor 26 is non-conducting and diodes 27, 28 and 30 are reverse biased and have no affect on the operation of the circuit. However, when the three-state input 14 is at the logical one level voltage, transistor 26 then turns on and diodes 27, 28 and 30 conduct. Diodes 27 and 28 form a low impedance path to ground at the out-of-phase signal, line 36, and at the input to the phase splitter stage, line 24, thereby removing any base current to the output transistor 46. Diode 30 forms a low impedance path to ground at the base of the output transistor 50. The result is that both output transistors 46 and 50 are forced into their non-conducting or high impedance state.

Note that in this circuit configuration of FIG. 1, the lower output drive transistor 46 must receive all of its base current through transistor 38 which in turn comes primarily from resistor 40. If the three-state capability of the circuit were not required, then the input terminal 14, transistor 26, and diodes 27 and 28 would be removed and diode 54 shown in phantom could be inserted as this is conventional in the art. Diodes 54 and 30 would then couple extra current from the load at output terminal 52 through transistor 38 and into the base of transistor 46 to add base drive to transistor 46 during the high to low transition of the output voltage at output terminal 52 and thereby improve the output voltage fall time. However, it is not possible to use diode 54 in a three-state logic circuit since diode 54 would produce a low impedance from the output terminal to ground when the three-state control input 14 was coupled to a logical one voltage level thereby defeating the purpose of a three-state output. Therefore the three-state prior art circuit of FIG. 1 does not have the capability to switch as rapidly from the high level to the low level at output terminal 52 without diode 54.

Figure 2:
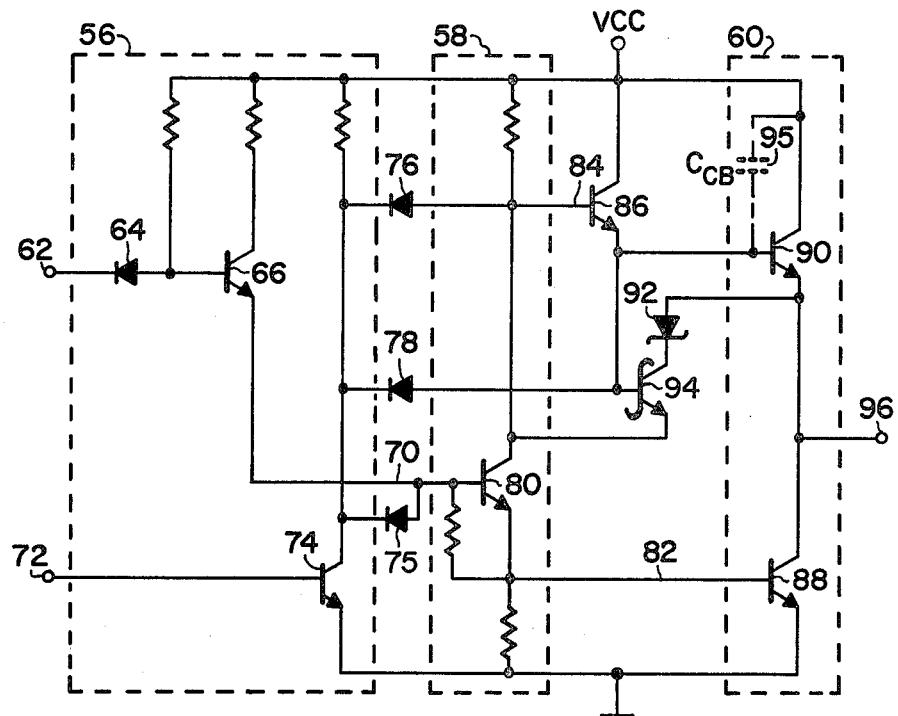
FIG. 2 is a preferred embodiment of the present invention employing transistor logic with three-state output capability.

The present invention, FIG. 2, improves switching speeds of the output driver section without the attendant low impedance problem. An input stage 56, phase splitting stage 58, and push-pull output driver stage 60 of FIG. 2 are identical to the input stage 10, phase splitting stage 22, and push-pull output driver stage 32 of FIG. 1. The logic signal at input 62 of FIG. 2 is coupled through diode 64 into an amplifying transistor 66 and connected to the phase splitting stage 58 through line 70. The three-state control input 72 is amplified through transistor 74 and coupled through diodes 75 and 76 into the phase splitting stage 58 and also coupled through diode 78 into the output driver stage 60. Transistor 80 converts the amplified logic input signal from line 70 into an in-phase signal at line 82 and an out-of-phase signal at line 84. The intermediate transistor amplifier 86 is the same as the intermediate transistor amplifier 48 of FIG. 1. In-phase signal line 82 drives the lower output transistor 88 of the push-pull output stage 60, and the upper out-of-phase signal 84 is amplified by transistor 86 and in turn drives the base of the upper output transistor 90.

The anode of diode 92 is connected to the juncture of the two output drive transistors 88 and 90 and the output terminal 96. The cathode of diode 92 is connected to the collector of transistor 94. The base of transistor 94 is connected to the base of the upper output drive transistor 90, and the emitter of transistor 94 is connected to the collector of the phase splitting transistor 80.

Operationally, during steady state conditions, transistor 94 is non-conducting and diode 92 is reverse biased. Transistor 94 and diode 92 are also non-conducting during transitions of the output from the low voltage state to the high voltage state. However, during transitions from the high voltage state to the low voltage state, the emitter of transistor 94 is pulled down by the collector of transistor 80 while the base of transistor 94 is held at the previous high potential due to the stored charge in the base of transistor 90 and also due to the collector to base capacitance 95 (shown in phantom) of transistor 90. During the first part of the high to low transition, transistor 94 begins to conduct, but since diode 92 is still reverse biased, transistor 94 initially has no collector current and therefore draws a large amount of base current. This helps to deplete the charge at the base of transistor 90 and helps it to turn off faster.

Later during the high to low transition after the collector voltage of transistor 94 drops sufficiently below the load voltage at the output terminal 96 to cause diode 92 to conduct, current flows from the load at terminal 96, through the diode 92, through the transistor 94, and through transistor 80 into the base of the lower drive transistor 88 thereby aiding the turn of transistor 88. The result is that there has been first a depletion of the stored charge from the upper drive transistor 90 allowing the transistor to turn off faster and secondly an increased base drive to the output drive transistor 88 which results in a faster turn on of transistor 88 and faster fall time of the output voltage at terminal 96. Since the load at the output terminal supplies current to the base of the lower drive transistor 88, the size of the load capacitance determines the magnitude and duration of the base boost current. Thus large capacitive loads, which require a heavily conductive transistor in order to switch states quickly, would supply more base boost current than would a lighter capacitive load. Also the base boost current removes electrical charge from the load thereby providing another path for sinking load current during the fall time of the output.

More importantly, this circuit allows the use of three-state logic configurations without the problems of the FIG. 1 circuit since a logical one voltage level at terminal 72 will cause transistor 74 to conduct, forward biasing diodes 75, 76 and 78 which together produce a low impedance path at the base and collector of transistor 80 and at the base of transistors 90 and 94. This terminates any base drive to transistors 88, 90, and 94 resulting in a high impedance at the output terminal 96. It is preferable to use a Schottky diode and a Schottky transistor as shown in FIG. 2 because the Schottky barrier devices exhibit lower threshold voltages than standard semiconductor devices and thereby provide a lower impedance path for the base boost current.

Although this invention has its most obvious advantage with three-state logic circuits, the invention can also be used with standard bipolar transistor logic circuits which do not incorporate the three-state configuration.

While the invention has been particularly shown and described with reference to preferred embodiments thereof, it will be understood by those skilled in the art that various changes in form and details may be made therein without departing from the spirit and scope of the invention.

What is claimed is:
1. A bipolar transistor logic circuit comprising:
 (a) an input means for receiving digital logic signals at a first input terminal;
 (b) a phase splitter means responsive to said digital logic signals for generating an in-phase signal and an out-of-phase signal;
 (c) push-pull output driver means including an in-phase transistor and an out-of-phase transistor coupled to said in-phase signal and to said out-of-phase signal respectively and to an output terminal for setting the output terminal to a predetermined digital level;

(d) feedback means coupled between the output terminal and said in-phase transistor for providing base drive current to said in-phase transistor and for removing stored base charge from said out-of-phase transistor during switching;

(e) three-state control means responsive to logic signals at a second input terminal and also being coupled to said output driver means and to said feedback means for selectively disabling said in-phase and out-of-phase transistors; and (f) said feedback means being responsive to quiescent voltage levels at the output terminal for isolating said three-state control means from the output terminal.

2. A bipolar transistor logic circuit as in claim 1 wherein:

(a) said feedback means comprises a switchable impedance means for assuming a low impedance state during the transition of said in-phase transistor to a conductive state and a high impedance state during other transition and quiescent conditions.

3. A bipolar transistor logic circuit as in claim 2 in which said feedback means comprises Schottky barrier devices.

* * * * *